(12) United States Patent
Mendel et al.

(10) Patent No.: US 8,775,894 B1
(45) Date of Patent: Jul. 8, 2014

(54) LANE SPECIFIC CRC

(75) Inventors: David W. Mendel, Sunnyvale, CA (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 389 days.

(21) Appl. No.: 13/168,095

(22) Filed: Jun. 24, 2011

(51) Int. Cl.
*H03M 13/00* (2006.01)
*H03M 13/03* (2006.01)

(52) U.S. Cl.
USPC ............ 714/758; 714/781; 714/788; 714/755

(58) Field of Classification Search
USPC ......... 714/755, 757, 758, 761–762, 774, 781, 714/786, 787, 788, 799, 746, 750, 752–753, 714/6.24, 52
See application file for complete search history.

(56) References Cited

U.S. PATENT DOCUMENTS

| | | | |
|---|---|---|---|
| 6,912,683 B2 * | 6/2005 | Rifaat et al. | 714/774 |
| 6,968,492 B1 * | 11/2005 | Annadurai et al. | 714/776 |
| 7,890,835 B2 * | 2/2011 | Kwak | 714/758 |
| 2008/0244361 A1 | 10/2008 | Walma | |

OTHER PUBLICATIONS

Koopman, P., 32-Bit Cyclic Redundancy Codes for Internet Applications, DSN '02 Proceedings of the 2002 International Conference on Dependable Systems and Networks, 2002, IEEE Computer Society, Washington, DC. (10 pages).

Walma, M., Pipelined Cyclic Redundancy Check (CRC) Calculation, Computer Communications and Networks, Proceedings of 16th International Conference, pp. 365-370, Aug. 2007.

\* cited by examiner

*Primary Examiner* — Christine Tu
(74) *Attorney, Agent, or Firm* — Mauriel Kapouytian Woods LLP; Ararat Kapouytian

(57) ABSTRACT

A method of data validation is provided. In one implementation, the method includes performing a cyclic redundancy check (CRC) on data transmitted over a channel having L lanes. In one implementation, the performing includes performing the CRC using n CRC bits and a CRC polynomial, where n is an integer equal to or greater than one and where L is an integer equal to or greater than one and represents the number of lanes in the channel. Further, in one implementation, the CRC polynomial is selected based on L. In one implementation, the method includes: performing a CRC on data, where the performing includes performing the CRC using n CRC bits, where n is an integer equal to or greater than one; and performing a checksum on the data, where the performing the checksum includes performing the checksum using m checksum bits, where m is an integer equal to or greater than one, where n plus m bits are allocated for validating the data. In one implementation, the performing the CRC and the performing the checksum are implemented by a hardware device.

20 Claims, 3 Drawing Sheets

LANE SPECIFIC CRC

BACKGROUND

Cyclic redundancy check (CRC) is a known technique for validating data. Generally, CRC is used to determine the validity of data sent from one device to another. For example, CRC is used to determine the validity of data that has been transmitted from a transmitter to a receiver. As another example, CRC is used to determine the validity of data read from a memory. A CRC of size n, where n is an integer greater than or equal to one and represents the number of bits used in the CRC, is guaranteed to detect any contiguous error burst of up to size n (i.e., n bits). A CRC of size n is commonly denoted as CRC-n. An error burst of n bits (which may also herein be referred to as a burst of n bits) represents n bits of random states, where any to all of the n bits may be in error. In addition to detecting bursts of size n, a CRC-n can also detect some multiple bursts that are separated in space, e.g., double bursts that are separated in space (i.e., are separated from one another by intervening bits).

As can be surmised from the above, one factor that characterizes a CRC is its length. Another factor that characterizes a CRC is the polynomial used in the CRC. These factors determine the effectiveness of a CRC in detecting errors. Another factor that determines the effectiveness of a CRC is the length of the data packet or data frame over which a CRC is applied. In the below discussion, data packet and data frame may be used interchangeably. Those skilled in the art would recognize, however, that a data frame is different from a data packet. A data frame includes the data packet, frame identifying information, and the CRC bits. Thus, each data frame whose data is to be checked using a CRC includes CRC bits.

CRCs of a particular polynomial type may be more effective than another at detecting a certain type of error. Also, for a given CRC polynomial, using a larger size CRC increases the likelihood of detecting larger error bursts, including larger multiple bursts. However, using a larger CRC is slower (or requires larger hardware resources) and takes more bandwidth to transmit.

Another known technique for validating data is checksum. As in the case of CRC, using a larger checksum increases the likelihood of detecting larger error bursts, including larger multiple bursts. However, using a larger checksum is slower (or requires larger hardware resources) and takes more bandwidth to transmit.

SUMMARY

In one aspect, an embodiment of the present invention provides a method including: performing a CRC on data transmitted over a channel having L lanes. In one embodiment, the performing includes performing the CRC using n CRC bits and a CRC polynomial, where n is an integer equal to or greater than one and where L is an integer equal to or greater than one and represents the number of lanes in the channel. Further, in one embodiment, the CRC polynomial is selected based on L. Moreover, in one embodiment, the performing is implemented by a hardware device.

In one embodiment, the CRC polynomial is also selected based on word size of words in which the data is transmitted. In yet another embodiment, the CRC polynomial is also selected based on frame size of frames in which the data is transmitted. In one embodiment, the method further includes selecting the CRC polynomial based on L.

An embodiment of the present invention provides a method including: performing a CRC on data, where the performing includes performing the CRC using n CRC bits, where n is an integer equal to or greater than one; and performing a checksum on the data, where the performing the checksum includes performing the checksum using m checksum bits, where m is an integer equal to or greater than one, where n plus m bits are allocated for validating the data. In one embodiment, the performing the CRC and the performing the checksum are implemented by a hardware device.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

Figure 1:
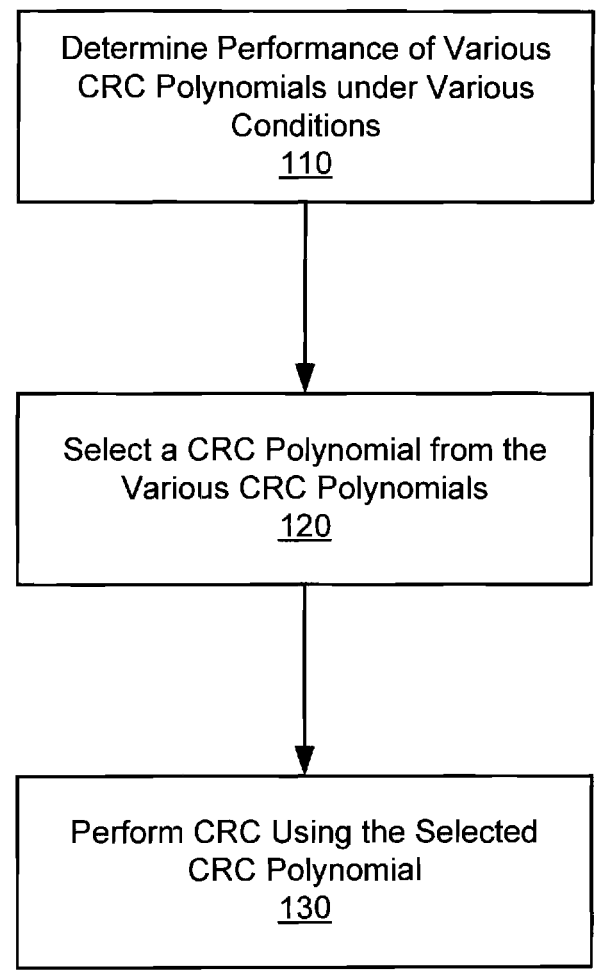
FIG. 1 is a flowchart illustrating one embodiment of a method of the present invention.

The following description is presented to enable a person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Prior to being sent over a multiple lane channel (which may also be referred to as a multi-lane channel), data in a single stream of words is striped across the multiple lanes. In other words, the words from a single stream of words "{word1} {word2} {word3} {word4} {word5} ... {wordx}" are spread out over the multiple lanes. For example, if the multiple lane channel is a 4 lane channel, then the data stream is striped across the four lanes as follows:

Lane1: {word1} {word5} {word9} ...
Lane2: {word2} {word6} {word10} ...
Lane3: {word3} {word7} {word11} ...
Lane4: {word4} {word8} {word12} ...

At the receiver, the transmitted data is serialized (i.e., placed back into a single stream). Thereafter, a CRC is applied to the serialized stream. As a result, an error burst that spans two adjacent words in the striped data (parallelized data) can become a double burst in the serialized stream. For example, an error burst in Lane 1 that spans the end of {word1} and the beginning of {word5} would become a double burst in the serialized stream "{word1} {word2} {word3} {word4} {word5} ... {wordx}." The first error burst of the double burst error would be in {word1 } and the second error burst would be in {word5}. In other words, the first and second error bursts would be separated by words 2, 3, and 4. Since the CRC is applied to the serialized stream, it would be applied to a double burst error. More generally, if an error burst is longer than L times WordSize (where L represents the number lanes in the multi-lane channel and WordSize represents the word size of words in which the data is transmitted), then a multi-burst of L or more bursts could be created out of a single original burst.

For a given number of lanes in the multiple lane channel, the distance between the bursts in a double burst is fixed. More specifically, the distance between the bursts is equal to L−1 words, where L represents the number of lanes in the multiple lane channel. This is an important special case in that, rather than being an arbitrary distance between bursts, the distance is predetermined. As a result of this predetermined nature of the distance, it is more feasible to perform an exhaustive analysis for bursts up to any pre-determined length to determine how well a given CRC polynomial performs under various conditions. Examples of the various conditions include the number of lanes over which the data is transmitted, the word size of words in which the data is transmitted, the frame size of frames in which the data is transmitted, the method of calculating the CRC on each word (e.g. most significant bit (MSB) to least significant bit (LSB) or LSB to MSB), any other form of error replication (such as created by some multiplicative scramblers as in 10 gigabit Ethernet), the desire to deal with multiple line bursts per packet, and the expected distribution of long single bursts versus multi-bursts. It is to be noted that not all the above conditions would be applicable in all circumstances. In one embodiment, the frame size is taken into consideration in situations where it is desired to determine capabilities of dealing with multiple error bursts, where the multiple error bursts happen separate from lane striping, as the frame size affects the potential separation of such multiple error bursts.

FIG. 1 is a flowchart of one embodiment of a method of the present invention. In FIG. 1, process 100 starts at 110, where the performance of various CRC polynomials is determined under various conditions. In one embodiment, these various conditions include the number of lanes over which the data is transmitted, the word size of words in which the data is transmitted, the frame size of frames in which the data is transmitted, the method of calculating the CRC on each word (e.g., MSB to LSB or LSB to MSB), any other form of error replication (such as created by some multiplicative scramblers as in 10 gigabit Ethernet), the desire to deal with multiple line bursts per packet, and the expected distribution of long single bursts versus multi-bursts.

In one embodiment, the above determination is performed by simulating various conditions and measuring results under those conditions. Methods of performing such analyses are well known in the art. Since CRC(A XOR B) is equal to CRC(A) XOR CRC(B), where XOR represents the exclusive OR function, it is sufficient to check the CRC against all desired error locations and the resulting behavior will be independent of the transmitted data. For example, to check a CRC's ability to find bursts up to 31 bits, one need only simulate the $2^{31}$ combinations of 31 bits. Note that in some CRC implementations, the words are read in one direction, e.g., most significant word (MSW) to least significant word (LSW), while the bits within a word are read LSB to MSB. In one embodiment, in such a case, all combinations of locations within the word are calculated. Such methods are, for example, described in more detail in the following references: Mathys Walma, "Pipelined Cyclic Redundancy Check (CRC) Calculation", Proceedings of the 16$^{th}$ International Conference on Computer Communications, Aug. 13-16, 2007; and Philip Koopman, "32-bit Cyclic Redundancy Codes for Internet Applications", DSN '02 Proceedings of the 2002 International Conference on Dependable Systems and Networks.

Table 1 below shows results of simulations for four common CRC-32 polynomials for 1, 2, 4, and 8 lanes. It is to be noted that the results in Table 1 are based on a word size of 32 bits, no error replication, and a search criteria of looking for the longest single burst that can be caught. It is also to be noted that the results of the simulations, even for a particular set of factors (e.g., number of lanes, word size, no error replication, etc.), might vary depending on the method used in determining the results such as whether a word is calculated MSW to LSW or LSW to MSW. Accordingly, the data in the Table 1 is intended to illustrate the general principles used in embodiments of the invention. It is not intended as a guide for deciding which specific CRC polynomial in Table 1 is to be used under a particular set of conditions.

TABLE 1

| Poly Name | Poly | 1 lane | 2 lanes | 4 lanes | 8 lanes |
|---|---|---|---|---|---|
| 802.3 | 0x4c11db7 | 31 | 30 | 27 | 30 |
| 802.3 reversed | 0x814141ab | 30 | 28 | 30 | 31 |
| Castagnoli | 0x1edc6f41 | 30 | 30 | 30 | 30 |
| Koopman | 0x741b8cd7 | 28 | 30 | 24 | 30 |

In Table 1, in the first column, under the heading "Poly Name," each row shows the name of the CRC-32 polynomial used. In the second column, under the heading "Poly," each row shows the polynomial used. In the third column, under the heading "1 lane," each row shows the total combined length, in bits, of two error bursts (i.e., a double error burst) which are guaranteed to be detected by the respective polynomial. In the fourth column, under the heading "2 lanes," each row shows the total combined length, in bits, of two separate error bursts (i.e., a double error burst) which are guaranteed to be detected by the respective polynomial. In the fifth column, under the heading "4 lanes," each row shows the total combined length, in bits, of two error bursts (i.e., a double error burst) which are guaranteed to be detected by the respective polynomial. Finally, in the sixth column, under the heading "8 lanes," each row shows the total combined length, in bits, of two error bursts (i.e., a double error burst) which are guaranteed to be detected by the respective polynomial.

As can be seen in Table 1, polynomial 802.3 is the best polynomial for detecting errors for data transmitted over 1 lane as it is guaranteed to detect a larger number of total combined error bits, namely 31 bits. For data transmitted over 2 lanes, polynomials 802.3, Castagnoli, and Koopman are equal in terms of the total combined error bits that they are guaranteed to detect, as each of these polynomials is guaranteed to detect 30 total combined error bits. This tie could be broken, if desired, by separately looking at each polynomial's ability to handle two independent bursts when combined with lane striping. For data transmitted over 4 lanes, polynomials 802.3 reversed and Castagnoli are equal in terms of the total combined error bits that they are guaranteed to detect, as each of these polynomials is guaranteed to detect 30 total combined error bits. For data transmitted over 8 lanes, polynomial 802.3 reversed is the best polynomial for detecting errors as it is guaranteed to detect a larger number of total combined error bits, namely 31 bits.

The polynomials and lane numbers covered in Table 1 are only exemplary. Simulations for other polynomials and lane numbers may be similarly performed. As noted above, the simulations results in Table 1 are for 32 CRC bits and a word size of 32 bits. Simulations may be performed for various number of CRC bits, for various word sizes, and for various frame sizes. Such simulations may be performed in software or hardware in ways known to one skilled in the art.

Referring back to FIG. 1, from 110, process 100 proceeds to 120. At 120, a CRC polynomial is selected from the various CRC polynomials of 110. In one embodiment, the CRC polynomial is selected based on the number of lanes in the channel over which the data is transmitted.

From 120, process 100 proceeds to 130. At 130, a CRC is performed on the data. More specifically, CRC is performed on the data using the CRC polynomial selected at 120.

Typically, the larger the CRC, the greater the likelihood that errors in the data will be detected. However, a larger CRC takes more hardware to compute and takes more bandwidth to transmit. There are situations where the goal is to provide the best possible coverage (i.e., increase the likelihood of detecting errors in the transmitted data) within a certain bit-limit.

Experimental evidence shows that allocating T validation bits to doing a combination of CRC and checksum validation is, in some cases, more effective at detecting errors than allocating all the T validation bits to only doing a CRC validation. For example, in some cases, performing a CRC-6 and a 6-bit checksum (which may be referred to as checksum-6) on data is more likely to detect errors than performing a CRC-12 on the data or a checksum-12 on the data. A checksum-n generally requires less hardware than a CRC-n, where n is an integer equal to or greater than one. As a result, a combination of CRC-n and a checksum-m (where m is an integer equal to or greater than one) also requires less hardware than a CRC-T (where T is an integer equal to n+m). Accordingly, using a combination of CRC and checksum, in addition being more effective in detecting errors, is also less expensive as it requires less hardware. Below is a description of an embodiment of the present invention directed to allocating validation bits between CRC and checksum.

Figure 2:
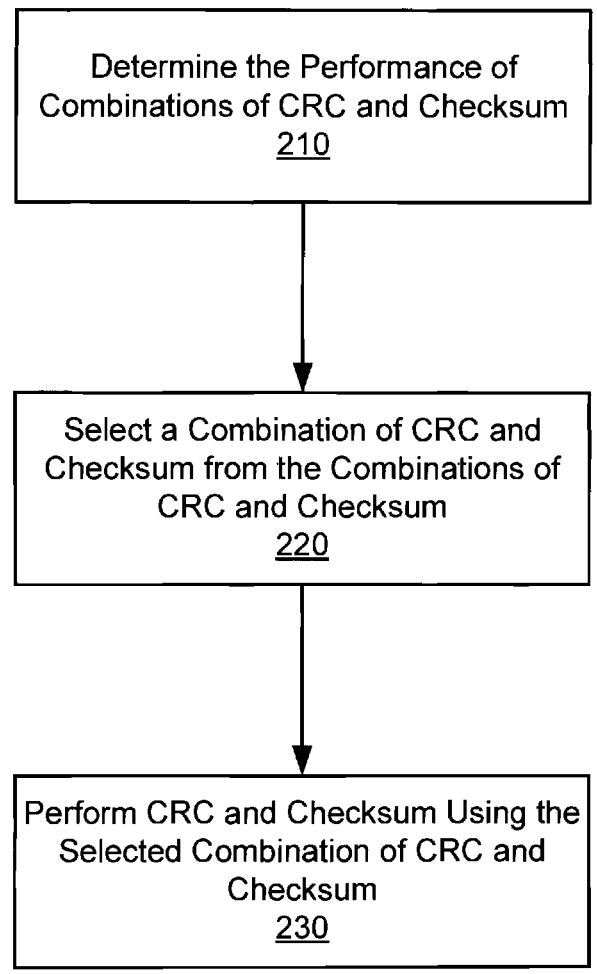
FIG. 2 is a flowchart illustrating another embodiment of a method of the present invention.

FIG. 2 is a flowchart of another embodiment of a method of the present invention. In FIG. 2, process 200 starts at 210, where results for various combinations of CRC and checksum are determined. In one embodiment, at 210, T validation bits are allocated between CRC-n and checksum-m in various combinations, where n, m, and T are as defined above.

In one embodiment, the determination at 210 is performed by simulating various error conditions of interest, making various allocations of the available validation bits between CRC and checksum, and measuring results for those various allocations. Examples of the various errors include independent errors, burst errors (including those with different lengths), errors correlated in time, and errors uncorrelated in time. In one embodiment, the CRC used is a CRC polynomial best suited for a particular set of error conditions.

From 210, process 200 proceeds to 220. At 220, a combination of CRC and checksum allocation is selected from the various combinations for which a determination was made at 210.

From 220, process 200 proceeds to 230. At 230, the selected combination of CRC and checksum is performed on the data. More specifically, CRC and checksum is performed on the data using the combination of CRC and checksum selected at 220. In one embodiment, at 230, the CRC and checksum are performed on the data in parallel. In another embodiment, at 230, the CRC and checksum are performed in series, i.e., sequentially.

Any to all steps of method 100 may be implemented by a hardware device. Similarly, any to all steps of method 200 may be implemented by a hardware device. The hardware device for implementing the methods may be a dedicated hardware device, a computer, or some other hardware device. In one embodiment, the dedicated hardware device is an integrated circuit (IC) or ICs. The IC may be a programmable logic device (PLD), an application specific IC (ASIC), a hybrid PLD-ASIC, or some other type of IC device. PLD is herein used broadly to include to field programmable gate arrays (FPGAs) and other programmable ICs.

Figure 3:
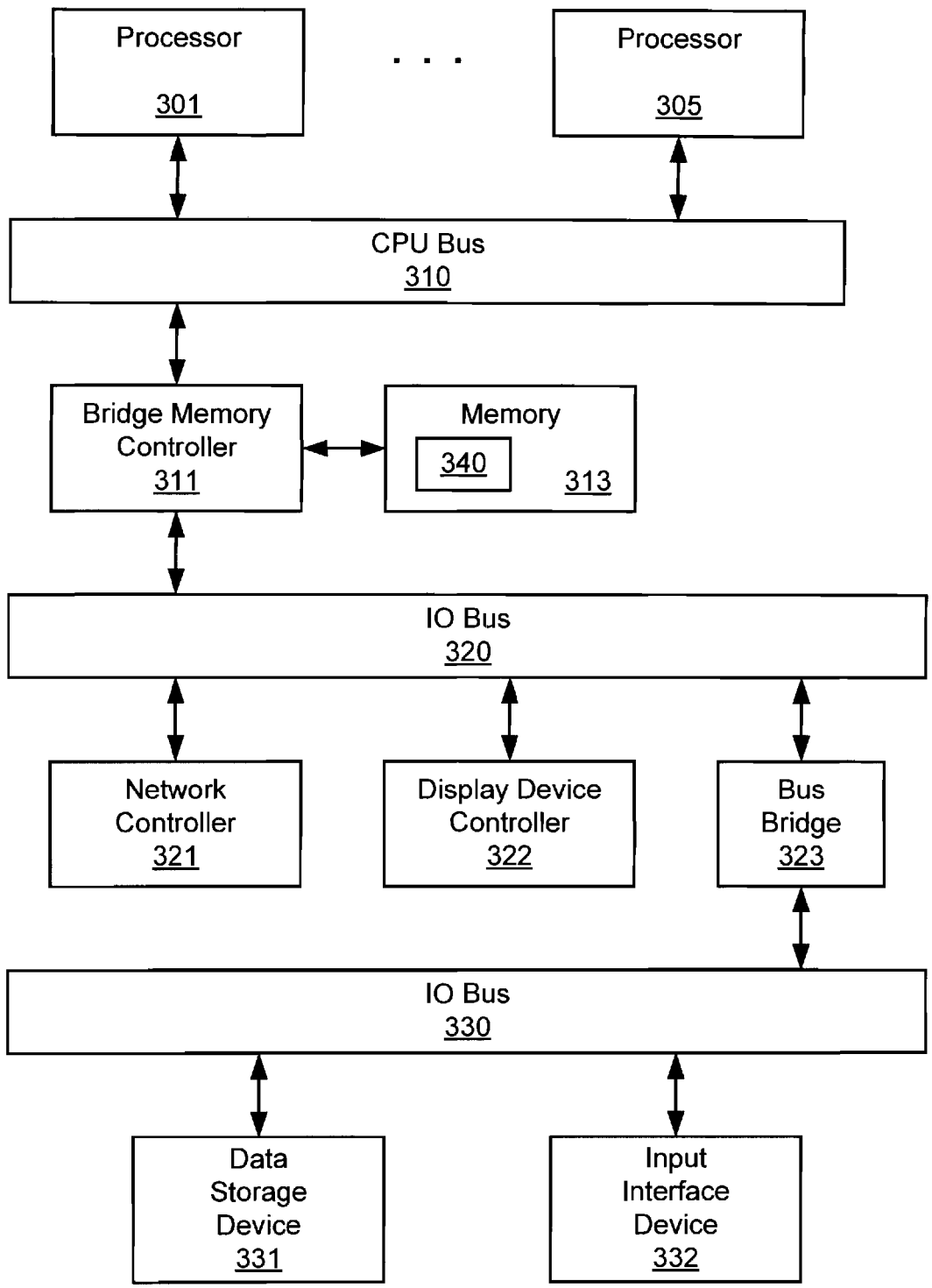
FIG. 3 is a block diagram of an exemplary computer system which may be used to perform embodiments of the methods of the present invention.

FIG. 3 is a block diagram of an exemplary computer system which may be used to perform embodiments of the methods of the present invention. Computer system 300 includes one or more processors that process data signals. As shown, computer system 300 includes first processor 301 and zth processor 305, where z may be any positive integer greater than one. Processors 301 and 305 may be a complex instruction set computer microprocessor, a reduced instruction set computing microprocessor, a very long instruction word microprocessor, a processor implementing a combination of instruction sets, a PLD, or other processor device. Processors 301 and 305 may be multi-core processors with multiple processor cores on each chip. Each of processors 301 and 305 and each of the processor cores may support one or more hardware threads. Processors 301 and 305 are coupled to central processing unit (CPU) bus 310 that transmits data signals between processors 301 and 305 and other components in computer system 300.

Computer system 300 includes memory 313. Memory 313 may be a dynamic random access memory (DRAM) device, a static random access memory (SRAM) device, and/or other memory device. Memory 313 may store instructions and code represented by data signals that may be executed by processor 301. A cache memory (not shown) may reside inside processor 301 that stores data signals stored in memory 313. The cache speeds access to memory by processor 301 by taking advantage of its locality of access. In an alternate embodiment of computer system 300, the cache resides external to processor 301. Bridge memory controller 311 is coupled to CPU bus 310 and memory 313. Bridge memory controller 311 directs data signals between processor 301, memory 313, and other components in computer system 300 and bridges the data signals between CPU bus 310, memory 313, and first IO bus 320.

First IO bus 320 may be a single bus or a combination of multiple buses. First IO bus 320 provides communication links between components in computer system 300. Network controller 321 is coupled to first IO bus 320. Network controller 321 may link computer system 300 to a network of computers (not shown) and supports communication among the machines. Display device controller 322 is coupled to first IO bus 320. Display device controller 322 allows coupling of a display device (not shown) to computer system 300 and acts as an interface between the display device and computer system 300.

Second IO bus 330 may be a single bus or a combination of multiple buses. Second IO bus 330 provides communication links between components in computer system 300. Data storage device 331 is coupled to second IO bus 330. Data storage device 331 may be a hard disk drive, a floppy disk drive, a CD-ROM device, a flash memory device or other mass storage device. Input interface device 332 is coupled to second IO bus 330. Input interface device 332 may be, for example, a keyboard and/or mouse controller or other input interface. Input interface device 332 may be a dedicated device or can reside in another device such as a bus controller or other controller. Input interface device 332 allows coupling of an input device to computer system 300 and transmits data signals from an input device to computer system 300. Bus bridge 323 couples first IO bus 320 to second IO bus 330. Bus bridge 323 operates to buffer and bridge data signals between first IO bus 320 and second IO bus 330. It should be appreciated that computer systems having a different architecture may also be used to implement computer system 300.

Software 340 for implementing embodiments of the methods of the present invention may reside in memory 313 and be executed by one or more of processors 301 and 305. Embodiments of the present invention may be provided as a computer program product or software. In one implementation, embodiments of the present invention may be provided as a machine-accessible or machine-readable medium (e.g., an electronically machine-accessible or machine-readable medium) having instructions. In one implementation, embodiments of the present invention may be provided as an article of manufacture that includes a machine-accessible or machine-readable medium having instructions. The instructions on the machine-accessible or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine-accessible medium" or "machine-readable medium" used herein shall include any medium that is capable of storing a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method comprising:
    performing a cyclic redundancy check (CRC) on data transmitted over a channel having L lanes, wherein the performing includes performing the CRC using n CRC bits and a CRC polynomial, wherein n is an integer equal to or greater than one, wherein L is an integer equal to or greater than one and represents number of lanes in the channel, wherein the CRC polynomial is selected based on L, and wherein the performing is implemented by a hardware device.

2. The method of claim 1, wherein the CRC polynomial is also selected based on word size of words in which the data is transmitted.

3. The method of claim 1, wherein the CRC polynomial is also selected based on whether the CRC is calculated, within a given word, most significant bit (MSB) to least significant bit (LSB) or LSB to MSB.

4. The method of claim 1, wherein the CRC polynomial is also selected based on whether the CRC is calculated on a lane that may have error replication.

5. The method of claim 1, wherein the CRC polynomial is also selected based on frame size of frames in which the data is transmitted.

6. The method of claim 1 further comprising selecting the CRC polynomial based on L.

7. The method of claim 6, wherein the selecting is further based on word size of words in which the data is transmitted.

8. The method of claim 7, wherein the selecting is further based on frame size of frames in which the data is transmitted.

9. The method of claim 1, wherein the hardware device is a dedicated hardware device or a computer.

10. A non-transitory computer-readable medium including a computer program, which, when executed on a computer, causes the computer to implement a method comprising:
    performing a cyclic redundancy check (CRC) on data transmitted over a channel having L lanes, wherein the performing includes performing the CRC using n CRC bits and a CRC polynomial, wherein n is an integer equal to or greater than one, wherein L is an integer equal to or greater than one and represents number of lanes in the channel, and wherein the CRC polynomial is selected based on L.

11. The non-transitory computer-readable medium of claim 10, wherein the CRC polynomial is also selected based on word size of words in which the data is transmitted.

12. The non-transitory computer-readable medium of claim 10, wherein the CRC polynomial is also selected based on frame size of frames in which the data is transmitted.

13. The non-transitory computer-readable medium of claim 10, wherein the method further comprises selecting the CRC polynomial based on L.

14. A method comprising:
    performing a cyclic redundancy check (CRC) on data, wherein the performing includes performing the CRC using n CRC bits, wherein n is an integer equal to or greater than one; and
    performing a checksum on the data, wherein the performing the checksum includes performing the checksum using m checksum bits, wherein m is an integer equal to or greater than one,
    wherein n plus m bits are allocated for validating the data and wherein the performing the CRC and the performing the checksum are implemented by a hardware device.

15. The method of claim 14, wherein the performing the CRC and the performing the checksum are performed in parallel.

16. The method of claim 14, wherein the performing the CRC and the performing the checksum are performed in series.

17. The method of claim 14, wherein n and m are selected based on results of simulation.

18. The method of claim 14, wherein the data is a data packet in a data frame, wherein the data frame has m plus n bits allocated for data validation.

19. The method of claim 14 further comprising selecting n and m.

20. The method of claim 14, wherein the hardware device is a dedicated hardware device or a computer.

* * * * *